US012775221B2

(12) United States Patent
Wichard

(10) Patent No.: US 12,775,221 B2
(45) Date of Patent: Oct. 27, 2026

(54) EUV LITHOGRAPHY SYSTEM COMPRISING A GAS-BINDING COMPONENT IN THE FORM OF A FOIL

(71) Applicant: Carl Zeiss SMT GmbH, Oberkochen (DE)

(72) Inventor: Ralf Wichard, Oberkochen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 76 days.

(21) Appl. No.: 18/590,076

(22) Filed: Feb. 28, 2024

(65) Prior Publication Data

US 2024/0201604 A1 Jun. 20, 2024

Related U.S. Application Data

(63) Continuation of application No. PCT/EP2022/067874, filed on Jun. 29, 2022.

(30) Foreign Application Priority Data

Sep. 14, 2021 (DE) ..................... 10 2021 210 101.1

(51) Int. Cl.
*G03F 7/20* (2006.01)
*G03F 7/00* (2006.01)

(52) U.S. Cl.
CPC ...... *G03F 7/70916* (2013.01); *G03F 7/70033* (2013.01); *G03F 7/70233* (2013.01); *G03F 7/70825* (2013.01)

(58) Field of Classification Search
CPC ............. G03F 7/70916; G03F 7/70033; G03F 7/70233; G03F 7/70825; H01L 21/0274
See application file for complete search history.

(56) References Cited

U.S. PATENT DOCUMENTS

| | | | |
|---|---|---|---|
| 7,473,908 | B2 | 1/2009 | Van Herpen et al. |
| 8,382,301 | B2 | 2/2013 | Ehm et al. |
| 8,585,224 | B2 | 11/2013 | Ehm et al. |
| 11,137,687 | B2 | 10/2021 | Liebaug et al. |

(Continued)

FOREIGN PATENT DOCUMENTS

| | | | |
|---|---|---|---|
| DE | 102008017888 | A1 | 1/2009 |
| DE | 102014204658 | A1 | 3/2015 |

(Continued)

OTHER PUBLICATIONS

International Search Report, PCT/EP2022/067874, Nov. 7, 2022, 4 pages.

(Continued)

*Primary Examiner* — Mesfin T Asfaw
(74) *Attorney, Agent, or Firm* — Edell, Shapiro & Finnan, LLC

(57) ABSTRACT

An EUV lithography system (1) including: a housing (26), at least one reflective optical element (M1, M2) disposed within an interior (27) of the housing (26), and at least one gas-binding component (31*a-c*) having a gas-binding material for binding gaseous contaminating substances (29) present in the interior (27). The gas-binding component is formed as a foil (31*a-c*) and a coating (33, 33*a,b*) containing the gas-binding material is applied on at least one side (32*a*, 32*b*) of the foil (31*a-c*).

18 Claims, 2 Drawing Sheets

(56) References Cited

U.S. PATENT DOCUMENTS

| | | | | |
|---|---|---|---|---|
| 2010/0085547 | A1* | 4/2010 | Labetski .............. | H05G 2/0094 355/53 |
| 2012/0216681 | A1 | 8/2012 | Metzmacher et al. | |
| 2020/0166847 | A1 | 5/2020 | Liebaug et al. | |

FOREIGN PATENT DOCUMENTS

| | | | |
|---|---|---|---|
| EP | 3034273 | A1 | 6/2016 |
| WO | 2008034582 | A2 | 3/2008 |
| WO | 2019025162 | A1 | 2/2019 |

OTHER PUBLICATIONS

German Office Action with English translation, Application No. 10 2021 2100101.1, Mar. 25, 2022, 4 pages.
International Preliminary Report on Patentability and the Written Opinion, PCT/EP2022/067874, Mar. 5, 2024, 5 pages.
Korean Office Action with English translation, Application No. 10-2024-7008033, Feb. 11, 2026, 11 pages.

* cited by examiner

EUV LITHOGRAPHY SYSTEM COMPRISING A GAS-BINDING COMPONENT IN THE FORM OF A FOIL

CROSS-REFERENCE TO RELATED APPLICATION

This is a Continuation of International Application PCT/EP2022/067874, which has an international filing date of Jun. 29, 2022, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2021 210 101.1 filed on Sep. 14, 2021.

FIELD OF THE INVENTION

The invention relates to an EUV lithography system, comprising: a housing, at least one optical element disposed within an interior of the housing, and at least one gas-binding component having a gas-binding material for binding of gaseous contaminating substances present in the interior.

BACKGROUND

For the purposes of this application, an EUV lithography system is understood to mean an optical system that can be used in the field of EUV lithography. In addition to a projection exposure apparatus for EUV lithography which serves for production of semiconductor components, the lithography system may, for example, be an inspection system for inspection of a photomask used in such a projection exposure apparatus (also referred to hereinafter as reticle), for inspection of a semiconductor substrate to be structured (also referred to hereinafter as wafer), or a metrology system which is used for measurement of a projection exposure apparatus for EUV lithography or parts thereof, for example for measurement of a projection optical unit.

In order to achieve the smallest possible structure width for the semiconductor components to be produced, state-of-the-art projection exposure apparatuses, also known as EUV lithography apparatuses, are designed for an operating wavelength in the extreme ultraviolet (EUV) wavelength range, i.e. within a range from about 5 nm to about 30 nm. Since wavelengths in this range are strongly absorbed by nearly all materials, it is typically not possible to use transmissive optical elements. Reflective optical elements must be used instead. Such optical elements that reflect EUV radiation may, for example, be mirrors, reflective monochromators, collimators or photomasks. Since EUV radiation is also strongly absorbed by air molecules, the beam path of the EUV radiation is arranged within a vacuum environment.

In EUV lithography apparatuses, gaseous contaminating substances present in the vacuum environment (also called contaminations hereinafter) lead to a reduction in the reflection of the mirrors and hence to a reduction in optical performance, system transmission and system throughput, i.e., the number of wafers per hour. As well as contaminations in the form of hydrocarbons, the outgassing of contaminations in the form of harmful chemical elements or compounds from components disposed in the vacuum environment leads to degradation of the mirrors. The harmful chemical elements or compounds may, for example, be hydrogen-volatile elements or compounds (HIO="hydrogen induced outgassing"), for example compounds of phosphorus, zinc, tin, sulfur, indium, magnesium or silicon.

In the context of analyses, it was found that one possible cause of the mirror contamination lies in the coverage of surfaces of the mechanical (i.e. non-optical) components installed in the vicinity of the mirror with contaminants including HIO elements or compounds that are redistributed from the surfaces of these components onto the surfaces of the mirrors under operating conditions.

It is not possible e.g., with stronger vacuum pumps, with getter pumps or cryopumps, or by purging of the lithography system, to sufficiently prevent the damaging elements or compounds from reaching the optical surfaces of the mirrors and causing unwanted degradation there. It is known that it is possible to dispose gas-binding components having at least one surface composed of a gas-binding material in the vacuum environment with the mirrors, in order to chemically bind or retain the contaminating substances, in particular the HIO compounds, in order thus to prevent, weaken or delay adsorption thereof on the surfaces of the mirrors.

U.S. Pat. No. 7,473,908B2 discloses a lithography apparatus comprising an object having a first surface designed to bind metallic contaminations, e.g. metals, metal oxides, metal hydroxides, metal hydrides, metal halides and/or metal oxyhalides of the elements Sn, Mn and/or Zn. The first surface may have a metallic surface, with the metal selected from the group comprising: Ru, Rh, Pd, Ag, Re, Os, Ir, Pt and/or Au.

DE 10 2014 204 658 A1 describes an optical arrangement having a casing with at least one component disposed therein that outgases contaminating substances on contact with activated hydrogen. An opening duct connects the component to a vacuum chamber with at least one optical element disposed therein. The inner wall of the opening duct may have a coating for reduction of the exit rate of the contaminating substances that contains a material selected from the group comprising: Rh, Ru, Ir, Pt, Ti, Ni, Pd and compounds thereof. For reduction of the entry rate of the activated hydrogen, the coating may contain a material selected from the group comprising: Rh, Ru, Ir, Pt, Ti, Ni, Pd, Al, Cu, Fe and compounds thereof.

US 2020/0166847 A1 describes an optical arrangement for EUV lithography which comprises at least one reflective optical element having a main body with a coating that reflects EUV radiation. At least one shield is fitted to at least one surface region of the main body and protects the surface region against any etching effect of a plasma surrounding the reflective optical element during operation of the optical arrangement. The material of the shield may be selected from the group comprising: metallic materials, in particular Cu, Co, Pt, Ir, Pd, Ru, Al, stainless steel, and ceramic materials, in particular $AlO_x$, $Al_2O_3$. The shield or cover may consist of a hydrogen recombination material or include a hydrogen recombination material. The hydrogen recombination material may serve as contamination getter material, for example when it is selected from the group comprising: Ir, Ru, Pt, Pd.

U.S. Pat. Nos 8,382,301 B2 and 8,585,224 B2 describe a projection exposure apparatus for EUV lithography that has a housing with at least one optical element disposed therein. Also disposed within the housing is at least one vacuum housing that surrounds at least the optical surface of the optical element. In one example, the vacuum housing serves as contamination reduction unit and consists of a gas-binding material on its inside at least in one subregion.

When a component having a gas-binding material is used for binding of gaseous contaminating substances, the problem exists that the gas-binding effect of the gas-binding material declines as the amount of contaminating substances bound on the surface of the component increases, such that the gas-binding component has to be exchanged after a certain service life. However, the installation and exchange of gas-binding components in the form of metal plates or the like is generally complex since such components are connected by a mechanical interface (for example via a screw connection) to fixedly installed components of the EUV lithography apparatus. The retrofitting of such gas-binding components into existing EUV lithography systems is not readily possible either.

SUMMARY

It is an object of the invention to provide an EUV lithography system having at least one gas-binding component that can be easily installed in the EUV lithography system and preferably easily exchanged when the gas-binding effect declines.

These and other objects are achieved by an EUV lithography system of the type specified above, in which the gas-binding component takes the form of a foil.

In accordance with the invention, a foil is used as a gas-binding component. A foil can be integrated into the EUV lithography system in a simpler manner and can typically be more easily exchanged than is the case for more complex and thicker gas-binding components, for example in the form of metal plates or the like, where a greater degree of complexity is required with regard to the design and the mechanical interface. With the aid of the gas-binding foil components of the invention, it is therefore possible to save effort, time and money. The advantages of the use of gas-binding components as such, i.e. the prevention or at least the delay of the exchange of degraded mirrors, submodules or systems, are also maintained in the case of gas-binding components in the form of foils.

Even if the foil cannot be readily exchanged, for example because it is permanently bonded to the housing or to a component disposed in the housing, the use of a gas-binding foil component may be advantageous since a foil can also be disposed in regions in the interior where the build space is restricted. In particular, it is possible here to exploit the fact that the foil is a thin, flexible component that can be matched to the geometry of the build space available, for example in that it is suitably bent or folded. It is also possible to match a gas-binding component in the form of a foil without difficulty to the size of the available build space by suitably cutting it to size. A gas-binding component in the form of a foil is additionally of good suitability for retrofitting of existing EUV lithography apparatuses in which the mechanical interface described above may be absent.

In one embodiment, the foil contains the gas-binding material. In that case, the foil itself is formed from a gas-binding material, such that it is possible to dispense with the applying of a gas-binding material to a surface of the foil. The gas-binding material of which the foil consists, or from which it has been formed, may, for example, be rhodium or ruthenium.

In a further embodiment, a coating containing the gas-binding material is applied on at least one side of the foil. In that case, the foil itself is typically not formed from a gas-binding material, but rather serves as a flexible carrier for the gas-binding material. The coating with the gas-binding material may be applied on one side of the foil, but it is also possible to apply two coatings with the gas-binding material to opposite sides of the foil. In this way, it is possible to virtually double the surface area on which the gas-binding material of the coating can absorb the contaminating gaseous substances. The two-sided coating of the foil can advantageously exploit the fact that the foil, rather than having to be connected over its full area to components installed in the EUV lithography system, may be sufficiently fixed by a punctiform connection of the foil at, for example, two, three or more adhesive bonding points in order to fix it in the interior of the housing. Alternatively, rather than adhesive bonding points, the foil can also be installed in the EUV lithography system along a defined contour line.

In one development, the coating has a thickness between 1 nm and 10 μm. If a coating is applied on both sides of the foil, the thickness stated above relates to the thickness of a coating applied on one side of the foil. It has been found to be favorable when the coating has a comparatively small thickness. The coating should very substantially cover the side of the foil to which it is applied, which, in the case of most coating materials, requires a thickness of the coating of several nanometers. The coating can be applied to the foil in different ways, for example by sputtering, by evaporating, by chemical vapor deposition (CVD), by galvanic processes, etc.

In a further embodiment, the gas-binding material is selected from the group comprising: Ta, Nb, Ti, Zr, Th, Ni, Ru, Rh. Additionally or alternatively to the materials mentioned, it is also possible to use other materials with a gas-binding function for the contaminating gaseous substances.

The gas-binding material used is generally a metal or an alloy that binds the contaminating gaseous substances by absorption, chemisorption or chemical reaction. The gas particles of the contaminating substances adsorbed on the surface of the gas-binding material diffuse rapidly into the interior of the gas-binding material and make room for further gas particles that hit the surface. The abovementioned materials and any further materials enable binding of the contaminating substances or a majority of types thereof, for example in the form of Si, Mg, etc., that are present in the EUV lithography system, more specifically in the interior thereof.

In one embodiment, the foil is a polymer foil, in particular a polyimide foil, or a metal foil. Such foils are comparatively inexpensive and robust, meaning that they typically withstand the ambient conditions in the interior of the EUV lithography system. If the foil is a metal foil made of ruthenium, for example, it is generally possible to dispense with the applying of a coating with a gas-binding material (see above). But the foil may also be formed from a metal having no gas-binding properties, for example from aluminum, when a coating made of a gas-binding material is applied to at least one side of the foil.

Metallized polymer foils, i.e. foils that consist of a polymer and to which a metallic coating or layer is applied, are used for various applications. For example, aluminum-coated Mylar foils are used for reliable protection from the sun. Adhesive films made of polyimide (for example those with the Kapton trade name) are used for different purposes (also in lithography), including in the form of adhesive tape. However, the use of foils made of gas-binding material or as carrier for a coating made of gas-binding material for reduction of contaminations in an EUV lithography system is unknown.

In a further embodiment, the foil has a thickness between 1 μm and 1 mm. Corresponding thicknesses of the foil typically lead to sufficient mechanical stability, which also permit use for coverage of large areas in the interior of the housing. At the same time, the limitation of the thickness at the top end leaves a certain flexibility, which facilitates the matching of the geometry of the foil to the geometry of the build space in which the foil is to be mounted. It is also possible to use very thin foils if required by the build space conditions or the volume available.

In one embodiment, the foil is connected, preferably in a detachable manner, to a surface of the housing and/or to at least one surface of a component disposed in the interior. As described above, it is advantageous when the foil can be installed in the interior and removed again from the interior in a simple manner, since it is possible in this way to reduce complexity and costs for maintenance operations when the foil is being retrofitted or receiving an upgrade, or when the foil has to be exchanged owing to the attainment of saturation of the gas-binding capacity. There are various options for the detachable connection of the foil to the housing or to the component. For example, the foil can be connected merely punctiform, for example by a punctiform adhesive connection, to the surface of the housing or the surface of the component. Such a punctiform connection at a small number of adhesion sites enables both simple installation and simple detaching of the foil from the respective surface.

The surface of the housing is typically the inside of a (vacuum) housing. The component disposed in the interior may be an optical component or a non-optical component. The gas-binding component in the form of the foil may serve, for example, to shield a component that outgases gaseous contaminating substances from the optical elements, for example from the mirrors.

In one development of this embodiment, an adhesive layer for connecting, preferably in a detachable manner, of the foil to the at least one surface of the housing and/or to the at least one surface of the at least one component disposed in the housing is applied to one side of the foil. In that case, the foil is typically secured, or more specifically adhesive-bonded, over an area or point by point on the surface of the housing or on the surface of (at least) one component disposed in the housing. The adhesive layer may be formed such that the foil can be detached from the surface virtually without residue after the adhesive bonding. This facilitates the removing of the foil when the gas-binding effect of the foil is no longer adequate, such that exchange for a new foil is required.

In a further development of this embodiment, the foil is connected by electrostatic attraction to the surface of the housing and/or to at least one surface of a component disposed in the housing. In that case too, the foil is typically two-dimensionally connected to the surface of the housing or component. In that case, the housing or component is generally formed from a metallic material at least at the surface on which the foil is mounted. It is possible here to exploit the fact that the housing is a vacuum chamber that in any case consists at least of large portions of a metallic material, typically of stainless steel. The same applies to many of the non-optical components disposed in the interior, which are likewise frequently metallic vacuum components.

In a further development, the component disposed in the housing forms a casing for encapsulation of a beam path of the EUV lithography system. In that case, the (at least one) gas-binding component in the form of the foil is bonded to the inside of the casing in order to trap gaseous contaminating substances in the vicinity of the beam path and keep them away from the reflective optical elements disposed in the beam path. Such a casing or a vacuum housing with a gas-binding material mounted on the inside is described, for example, in U.S. Pat. No. 8,382,301 B2, cited at the outset, or in U.S. Pat. No. 8,585,224 B2. If the gas-binding material, as described therein, is applied to the inside of the casing or vacuum housing in the form of a coating, the gas-binding material can be exchanged only when the vacuum housing as a whole is being exchanged. In the case of use of the foil described here, which is typically connected in a detachable manner to the inside of the casing, by contrast, such an exchange is generally possible without difficulty.

Further features and advantages of the invention will become apparent from the description of working examples of the invention that follows, with reference to the figures of the drawing, which show details salient to the invention, and from the claims. The individual features can be implemented individually in their own right or collectively in any combination in variants of the invention.

BRIEF DESCRIPTION OF THE DRAWINGS

Working examples are shown in the schematic drawing and are described in detail in the description which follows. The figures show.

DETAILED DESCRIPTION

Figure 1:
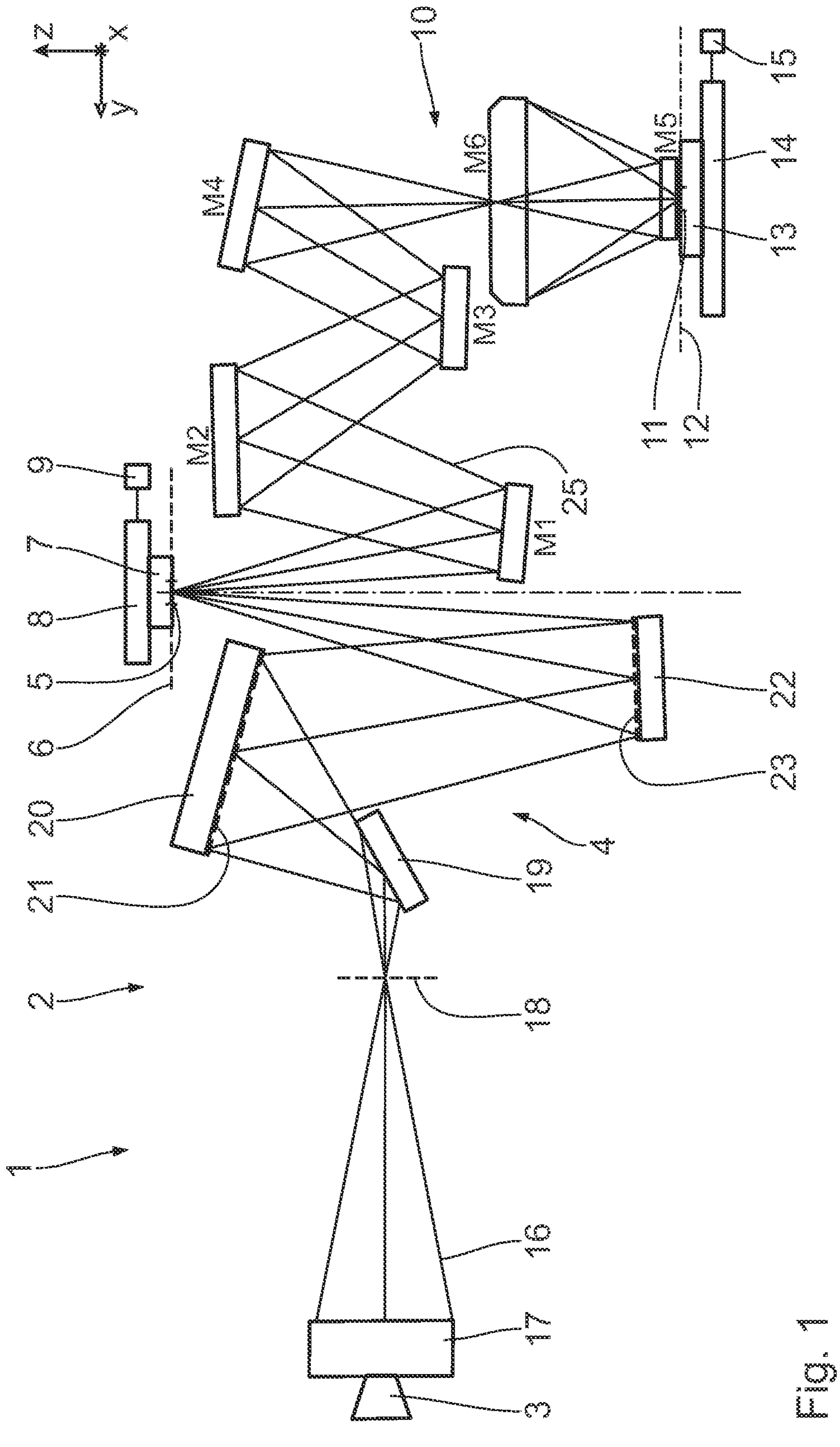
FIG. 1 a schematic meridional section through a projection exposure apparatus for EUV projection lithography, FIG. 2 a schematic diagram of a detail of the beam path of the projection exposure apparatus of FIG. 1 with a casing for encapsulating the beam path and with gas-binding foil components, and FIGS. 3A-C schematic diagrams of a detail of a gas-binding component in the form of a foil which is adhesively bonded to a surface (FIG. 3A), is freely positioned in space (FIG. 3B) or is retained on a surface by electrostatic attraction (FIG. 3C).

In the following description of the drawings, identical reference signs are used for identical, functionally identical or analogous components.

The salient components of an optical arrangement for EUV lithography in the form of a microlithographic projection exposure apparatus 1 are described by way of example below with reference to FIG. 1. The description of the basic setup of the projection exposure apparatus 1 and the components thereof should not be considered to be restrictive here.

One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 may also be provided in the form of a module separate from the rest of the illumination system. In this case, the illumination system does not include the light source 3.

A reticle 7 arranged in the object field 5 is illuminated through the illumination system 2. The reticle 7 is held by a reticle holder 8. The reticle holder 8 is displaceable, in particular in a scanning direction, by way of a reticle displacement drive 9.

FIG. 1 shows a Cartesian xyz coordinate system in which the x direction extends perpendicularly into the plane of the drawing, the y direction extends horizontally, and the z direction extends vertically. The scanning direction extends in the y direction in FIG. 1, and the z direction extends perpendicularly to the object plane 6.

The projection exposure apparatus 1 also includes a projection system 10. The projection system 10 is used to image the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 is displaceable, in particular in the y direction, by way of a wafer displacement drive 15. The displacement of the reticle 7 on the one hand by way of the reticle displacement drive 9 and the displacement of the wafer 13 on the other hand by way of the wafer displacement drive 15 may be synchronized with one another.

The radiation source 3 is an EUV radiation source. The radiation source 3 emits, in particular, EUV radiation 16, which is also referred to below as used radiation, illumination radiation or illumination light. In particular, the used radiation has a wavelength in the range between 5 nm and 30 nm. The radiation source 3 may be a plasma source, for example an LPP source (Laser Produced Plasma) or a GDPP source (Gas Discharge Produced Plasma). It may also be a synchrotron-based radiation source. The radiation source 3 may be a free electron laser (FEL).

The illumination radiation 16 emanating from the radiation source 3 is focused by a collector mirror 17. The collector mirror 17 may be a collector mirror with one or more ellipsoidal and/or hyperboloidal reflection surfaces. The illumination radiation 16 may be incident on the at least one reflection surface of the collector mirror 17 with grazing incidence (GI), which is to say at angles of incidence of greater than 45°, or with normal incidence (NI), which is to say at angles of incidence of less than 45°. The collector mirror 17 may be structured and/or coated, firstly to optimize its reflectivity for the used radiation and secondly to suppress extraneous light.

The illumination radiation 16 propagates through an intermediate focus in an intermediate focal plane 18 downstream of the collector mirror 17. The intermediate focal plane 18 may constitute a separation between a radiation source module, comprising the radiation source 3 and the collector mirror 17, and the illumination optical unit 4.

The illumination optical unit 4 comprises a deflection mirror 19 and, arranged downstream thereof in the beam path, a first facet mirror 20. The deflection mirror 19 may be a plane deflection mirror or, alternatively, a mirror with a beam-influencing effect that goes beyond the purely deflecting effect. As an alternative or in addition, the deflection mirror 19 may be in the form of a spectral filter that separates a used light wavelength of the illumination radiation 16 from extraneous light at a wavelength deviating therefrom. The first facet mirror 20 comprises a plurality of individual first facets 21, which are also referred to below as field facets. FIG. 1 depicts only some of said facets 21 by way of example. In the beam path of the illumination optical unit 4, a second facet mirror 22 is arranged downstream of the first facet mirror 20. The second facet mirror 22 comprises a plurality of second facets 23.

The illumination optical unit 4 thus forms a double-faceted system. This fundamental principle is also referred to as a fly's eye integrator. The individual first facets 21 are imaged into the object field 5 with the aid of the second facet mirror 22. The second facet mirror 22 is the last beam-shaping mirror or indeed the last mirror for the illumination radiation 16 in the beam path upstream of the object field 5.

The projection system 10 comprises a plurality of mirrors Mi, which are consecutively numbered in accordance with their arrangement in the beam path of the projection exposure apparatus 1.

In the example illustrated in FIG. 1, the projection system 10 comprises six mirrors M1 to M6. Alternatives with four, eight, ten, twelve or any other number of mirrors Mi are likewise possible. The penultimate mirror M5 and the last mirror M6 each have a through opening for the illumination radiation 16. The projection system 10 is a doubly obscured optical unit. The projection optical unit 10 has an image-side numerical aperture that is greater than 0.4 or 0.5 and may also be greater than 0.6, and may, for example, be 0.7 or 0.75.

Just like the mirrors of the illumination optical unit 4, the mirrors Mi may have a highly reflective coating for the illumination radiation 16.

Figure 2:
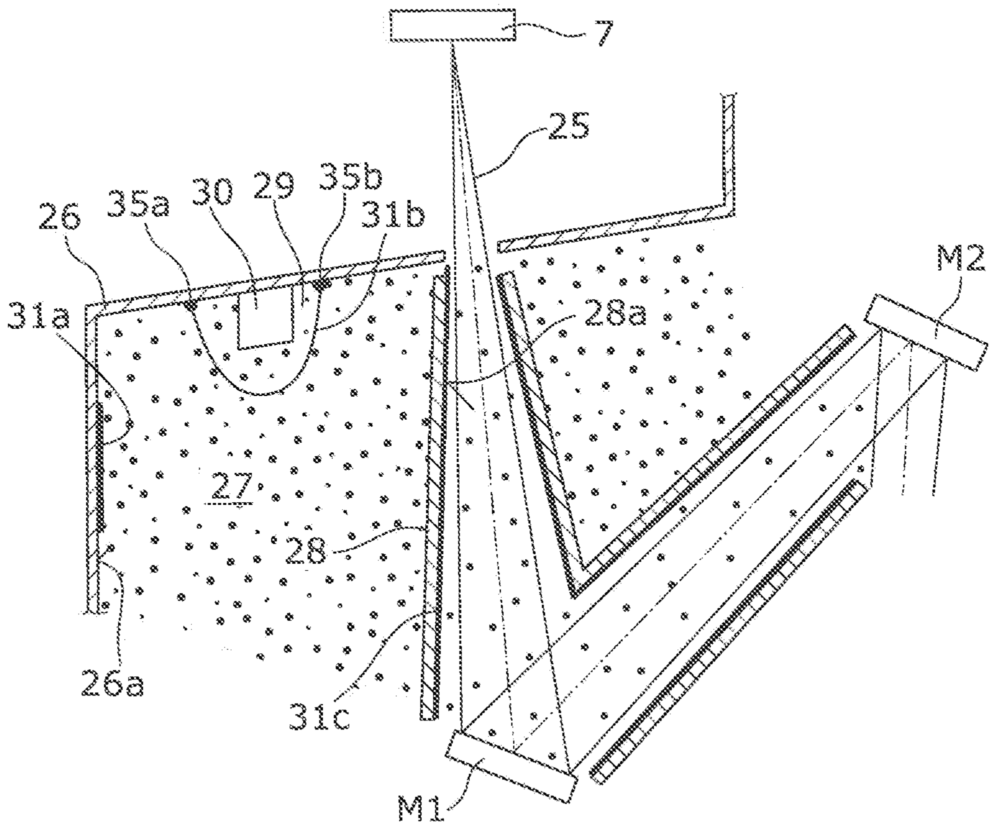

FIG. 2 shows a detail of the projection optical unit 10 from FIG. 1 with a beam path 25 that proceeds from the reticle 7 and passes through an opening in a housing 26 in which the projection optical unit 10 is disposed. Within the housing 26 is an interior 27 in which there exists a vacuum environment which is produced with the aid of vacuum pumps (not shown in the figure). There are six mirrors Mi disposed in the interior 27, of which FIG. 2 shows the first mirror M1 and the second mirror M2.

As likewise apparent in FIG. 2, there is a casing 28 disposed in the interior 27, which essentially surrounds or encapsulates the beam path 25 in the projection system 10, as described in U.S. Pat. No. 8,382,301 B2 or in U.S. Pat. No. 8,585,224 B2 for example, which are incorporated into this application in their entireties by reference. The casing 28 is a vacuum housing which is composed of multiple housing parts and consists essentially of stainless steel in the example shown. As likewise apparent in FIG. 2, the geometry of the casing 28 is matched to the geometry of the beam path 25, meaning that the geometry of the casing 28 follows the geometry of the beam path, meaning that the cross section thereof increases or decreases when the size of the cross section of the beam path 25 increases or decreases.

There are contaminating gaseous substances 29 in the interior 27 of the housing 26, which are indicated by dotted lines in FIG. 2. The volume within the casing 28 is typically purged by a purge gas, such that there is generally a smaller amount of contaminating gaseous substances 29 within the casing 28 than outside the casing 28. Likewise shown in FIG. 2 is a component 30, for example a sensor, actuator or the like, which outgases the contaminating gaseous substances 29 when the component 30 comes into contact with hydrogen present in the interior 27, especially with activated hydrogen. The activated hydrogen is formed from molecular hydrogen present in the interior 27 by an interaction with the illumination radiation or EUV radiation 16.

The contaminating substances 29 that outgas from component 30 are what are called HIO elements or HIO compounds, for example compounds of phosphorus, zinc, tin, sulfur, indium, magnesium or silicon. If the gaseous contaminating substances 29 reach the optical surfaces of the mirrors M1 to M6, these are deposited on the surfaces of the mirrors M1 to M6 and reduce the transmission thereof. The HIO compounds deposited on the surfaces of the mirrors M1 to M6 can additionally be removed only with great difficulty, if at all, from the surfaces of the mirrors M1 to M6.

Figures 3A, 3B, 3C:
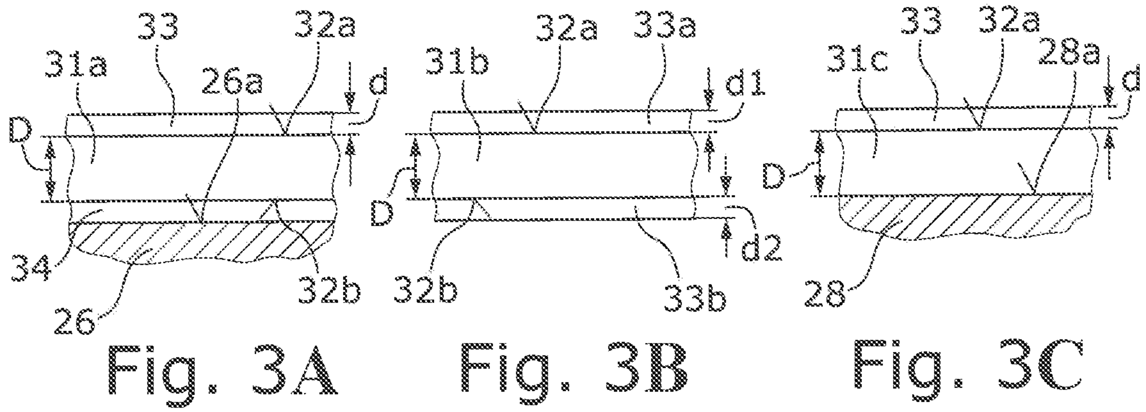

In order to prevent the gaseous contaminating substances 29 from reaching the mirrors M1 to M6, FIG. 2 shows, by way of example, three gas-binding components 31*a-c* in the interior 27, which take the form of foils and are each shown in respective section diagrams in FIGS. 3A-C.

In the gas-binding component in the form of a foil 31*a* which is shown in FIG. 3A, a gas-binding coating 33 is applied to a first side 32*a* of the foil 31*a*. An adhesive layer 34 is applied to a second side 32*b* of the foil 31*a*, which serves to two-dimensionally connect the foil 31*a* on its second side 32*b* to a surface 26*a* on the inside of the housing 26, as shown in FIG. 2. The two-dimensional adhesive connection of foil 31*a* to surface 26*a* on the inside of housing 26 is a preferably detachable adhesive connection. In this way, the gas-binding component in the form of the foil 31*a* can be detached in a simple manner from the surface 26*a* of the housing 26 and exchanged for a new foil 31*a* when the gas-binding effect of the gas-binding material of the coating 33 has decreased to such an extent as to require exchange of the foil 31*a*.

The gas-binding foil component 31*b* shown in FIG. 3B, in addition to a gas-binding coating 33*a* applied on a first side 32*a* of the foil 31*b*, has a second gas-binding coating 33*b* on a second, opposite side 32*b* of the foil 31*b*. The foil 31*b* shown in FIG. 3B may be freely positioned in space and, in the example shown in FIG. 2, is merely punctiform adhesively connected to the surface 26*a* on the inside of the housing 26. FIG. 2 shows, by way of example, two adhesive bonding points 35*a,b* at which the foil 31*b* is connected to the housing 26. The punctiform connection of the foil 31*b* to the housing 26 can likewise be detached without any great difficulty when the foil 31*b* is to be exchanged. As likewise apparent in FIG. 2, the foil 31*b* serves to shield the component 30 that outgases contaminating substances from the rest of the interior 27 as substantially as possible, in order in this way to bind a maximum proportion of the gaseous contaminating substances 29 produced by the outgassing component 30. The first coating 33*a* on the first side 32*a* of the foil 31*b* binds these contaminating substances 29 outgassed by component 30; the second coating 33*b* on the second side 32*b* of the foil 31*b* binds these gaseous contaminating substances 29 present in the rest of the interior 27.

The foil 31*c* shown in FIG. 3C is formed in accordance with the foil 31*a* shown in FIG. 3*a*, but this has no adhesive layer, and is instead applied directly to a surface 28*a* on the inside of the housing 28, as apparent in FIG. 2. The foil 31*c* shown in FIG. 3C is held by electrostatic interaction on the surface 28*a* on the inside of the casing 28, meaning that it is detachably connected to the surface 28*a* on the inside of the housing 28. It is favorable for the holding of the foil 31*c* by electrostatic interaction that the casing 28 consists essentially of stainless steel (see above). The use of a foil 31*c* with a gas-binding coating 33 on a first side 32*a* of the foil 31*c* for lining of the inside of the casing 28 is favorable since this can be exchanged in a simple manner. Moreover, there is generally only a small amount of build space available within the casing 28, and it is therefore virtually impossible to arrange gas-binding components in the form of metal sheets or the like within the casing 28.

In the three examples shown in FIGS. 3A-C, the gas-binding material is present in the coating 33, 33*a,b*, or the gas-binding material forms the coating 33, 33*a,b*. The gas-binding material in the example shown is a metallic material selected from the group comprising: Ta, Nb, Ti, Zr, Th, Ni, Ru, Rh. But it will be apparent that it is also possible to use other materials for the coating of the foils 31*a-c* that have a gas-binding effect in respect of the contaminating gaseous substances 29 in the interior 27. The coating 33, 33*a,b* is deposited onto the foil 31*a-c* with the aid of a conventional coating method, for example by sputtering, by evaporating, by chemical vapor deposition (CVD), by galvanic processes, etc.

By contrast with what is shown in FIGS. 3A-C, the foil 31*a-c* may itself have a gas-binding effect. In that case, the foil 31*a-c* itself is produced from a gas-binding material. For example, the foil 31*a-c* in this case may be a ruthenium foil. It is generally possible in this case to dispense with the provision of the coating 33, 33*a,b* shown in FIGS. 3A-C.

The foil 31*a-c* typically consists of a non-gas-binding material. The foil 31*a-c* may be a polymer foil, for example a polyimide foil, or a metal foil, for example an aluminum foil, provided with a gas-binding coating 33, 33*a,b*. The foil 31*a-c* typically has a thickness D between 1 μm and 1 mm. Especially if the build space is very limited, it is possible to use a comparatively thin foil 31*a-c* having a thickness D in the order of magnitude of a few micrometers. The coating 33 that is applied to the first side 32*a* of the foils 31*a,c* shown in FIG. 3A and FIG. 3C respectively has a thickness d between 1 nm and 10 μm. The same applies to the respective thicknesses d1, d2 of the coatings 33*a,b* that are applied to the two sides 32*a,b* of the foil 31*b* shown in FIG. 3B.

Gas-binding components in the form of foils 31*a-c* may be disposed not only in the interior 27 of the housing 26 of the projection system 10 of the projection exposure apparatus 1, but also in the interiors of corresponding housings of the illumination system 2, the light source 3 or a housing surrounding the illumination system 2 and the projection system 10. Gas-binding components in the form of foils 31*a-c* may be used not only in the projection exposure apparatus 1 shown in FIG. 1 but also in other EUV lithography systems, in order to bind contaminating gaseous substances 29.

What is claimed is:

1. An extreme ultraviolet (EUV) lithography system, comprising:

a housing having an interior, at least one reflective optical element disposed within the interior of the housing, and at least one gas-binding component having a gas-binding material for binding of gaseous contaminating substances present in the interior, wherein the gas-binding component is configured as a foil, wherein a coating containing the gas-binding material is applied on at least one side of the foil, and wherein the foil has a thickness between 1 μm and 1 mm;

wherein the gas-binding material of the coating is selected from the group consisting of: Ta, Nb, Ti, Zr, Th, Ni, Ru, Rh; and wherein the foil is connected to a surface of the housing.

2. The EUV lithography system as claimed in claim 1, wherein the foil contains the gas-binding material.

3. The EUV lithography system as claimed in claim 1, wherein the coating has a thickness between 1 nm and 10 μm.

4. The EUV lithography system as claimed in claim 1, wherein the foil is a polymer foil or a metal foil.

5. The EUV lithography system as claimed in claim 4, wherein the polymer foil is a polyimide foil.

6. The EUV lithography system as claimed in claim 1, wherein the foil is connected to at least one surface of at least one component disposed in the interior of the housing.

7. The EUV lithography system as claimed in claim 6, wherein the component disposed in the interior of the housing forms a casing encapsulating a beam path of the EUV lithography system.

8. The EUV lithography system as claimed in claim 1, wherein the foil is detachably connected to the surface of the housing.

9. The EUV lithography system as claimed in claim 1, wherein an adhesive layer for connecting the foil to the surface of the housing is applied to one side of the foil.

10. The EUV lithography system as claimed in claim 9, wherein the adhesive layer detachably connects the foil to the surface of the housing and/or to the at least one surface of the at least one component disposed in the interior of the housing.

11. The EUV lithography system as claimed in claim 1, wherein the foil is connected by electrostatic attraction to the surface of the housing.

12. The EUV lithography system as claimed in claim 1, wherein the coating is formed at an interface between the gas-binding component and the interior of the housing.

13. The EUV lithography system as claimed in claim 1, wherein a two-dimensional surface of the foil extends along the surface of the housing.

14. The EUV lithography system as claimed in claim 1, wherein the foil comprises a first side and a second side, and wherein the first side is adhered to and extends along a two-dimensional portion of the surface of the housing.

15. An extreme ultraviolet (EUV) lithography system, comprising:

a housing having an interior, at least one reflective optical element disposed within the interior of the housing, and at least one gas-binding component having a gas-binding material for binding of gaseous contaminating substances present in the interior, wherein the gas-binding component is configured as a foil, wherein a coating containing the gas-binding material is applied on at least one side of the foil, and wherein the foil has a thickness between 1 μm and 1 mm;

wherein the gas-binding material of the coating is selected from the group consisting of: Ta, Nb, Ti, Zr, Th, Ni, Ru, Rh;

wherein the component disposed in the interior of the housing forms a casing encapsulating a beam path of the EUV lithography system; and wherein the foil is connected to a surface of the casing.

16. The EUV lithography system as claimed in claim 15, wherein the foil is detachably connected to the at least one component disposed in the interior of the housing.

17. The EUV lithography system as claimed in claim 15, wherein an adhesive layer for connecting the foil to the at least one component disposed in the interior of the housing is applied to one side of the foil.

18. The EUV lithography system as claimed in claim 15, wherein the foil is connected by electrostatic attraction to the at least one surface of the at least one component disposed in the interior of the housing.

* * * * *